United States Patent
Fan et al.

(10) Patent No.: US 10,630,526 B2
(45) Date of Patent: Apr. 21, 2020

(54) ESTIMATION APPARATUS FOR IQ IMBALANCE OF OPTICAL TRANSMITTER, COMPENSATION APPARATUS FOR IQ IMBALANCE OF OPTICAL TRANSMITTER AND ELECTRONIC EQUIPMENT

(71) Applicant: FUJITSU LIMITED, Kawasaki-shi, Kanagawa (JP)

(72) Inventors: Yangyang Fan, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/163,975

(22) Filed: Oct. 18, 2018

(65) Prior Publication Data

US 2019/0132183 A1 May 2, 2019

(30) Foreign Application Priority Data

Oct. 27, 2017 (CN) .......................... 2017 1 1021004

(51) Int. Cl.
| | |
|---|---|
| H04L 27/36 | (2006.01) |
| H03D 3/00 | (2006.01) |
| H04L 27/38 | (2006.01) |
| H04L 27/00 | (2006.01) |

(52) U.S. Cl.
CPC .......... *H04L 27/364* (2013.01); *H03D 3/009* (2013.01); *H04L 27/0014* (2013.01); *H04L 27/3863* (2013.01)

(58) Field of Classification Search
CPC .............. H04B 10/613; H04B 10/6165; H04L 27/3863; H04L 27/364; H04L 27/0014; H03D 3/009
See application file for complete search history.

(56) References Cited

U.S. PATENT DOCUMENTS

| | | | |
|---|---|---|---|
| 9,160,586 B1 | 10/2015 | Hu et al. | |
| 2002/0071506 A1* | 6/2002 | Lindquist | H03D 3/008 375/344 |
| 2005/0196176 A1* | 9/2005 | Sun | H04B 10/2572 398/152 |
| 2010/0303474 A1* | 12/2010 | Nakashima | H04B 10/61 398/210 |

FOREIGN PATENT DOCUMENTS

| | | |
|---|---|---|
| CN | 105162533 A | 12/2015 |
| CN | 105610760 A | 5/2016 |
| CN | 105847198 A | 8/2016 |

OTHER PUBLICATIONS

Nguyen et al., "Blind Adaptive Transmitter IQ Imbalance Compensation in M-QAM Optical Coherent Systems", IEEE ICC 2016—Optical Networks and Systems, 6 pgs.

* cited by examiner

*Primary Examiner* — Sung S Ahn
(74) *Attorney, Agent, or Firm* — Staas & Halsey LLP

(57) ABSTRACT

An estimation apparatus for IQ imbalance of an optical transmitter, a compensation apparatus for IQ imbalance of an optical transmitter and electronic equipment; wherein, estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

11 Claims, 8 Drawing Sheets

ESTIMATION APPARATUS FOR IQ IMBALANCE OF OPTICAL TRANSMITTER, COMPENSATION APPARATUS FOR IQ IMBALANCE OF OPTICAL TRANSMITTER AND ELECTRONIC EQUIPMENT

CROSS-REFERENCE TO RELATED APPLICATIONS

This application claims the benefit of Chinese Application No. 201711021004.8, filed Oct. 27, 2017, in the State Intellectual Property Office of China, the disclosure of which is incorporated herein by reference.

BACKGROUND

1. Field

This disclosure relates to the field of communications technologies, and in particular to an estimation apparatus for IQ imbalance of an optical transmitter, a compensation apparatus for IQ imbalance of an optical transmitter and electronic equipment.

2. Description of the Related Art

Coherent optical communications systems have developed rapidly in recent years due to their excellent anti-dispersion performance, the use of dispersion-free compensation optical fibers, and relatively high sensitivity of a receiver. In a high-speed optical communications system, it is generally required to provide a modulator in an optical transmitter to modulate a transmitted signal where in-phase and quadrature (IQ) modulators are widely used in optical communications systems to generate transmitted signals of high spectral efficiency.

FIG. 1 is a schematic diagram of a modulator of an optical transmitter in the related art. As shown by a dotted box in FIG. 1, a modulator 101 of the optical transmitter has two Mach-Zehnder modulators (MZMs), respectively referred to as a first Mach-Zehnder modulator 102 and a second Mach-Zehnder modulator 103, and a phase modulator (PM) 104, the first Mach-Zehnder modulator 102 and the second Mach-Zehnder modulator 103 being respectively used for modulating driving signals $v_{rf,I}$ and $v_{rf,Q}$ of an I path and a Q path, and the phase modulator 104 introducing a phase difference of 90° between the I path and the Q path. Due to changes of ambient temperatures, and device aging, etc., drifts may possibly occur in three bias points (denoted by bias I, bias Q and bias P) of the modulator, which may make them deviated from an optimal working points. In order to ensure a modulation performance of the modulator, bias voltages $V_I$, $V_Q$ and $V_P$ on the three bias points, bias I, bias Q and bias P, are controlled according to a result of detection of an output optical field of the modulator 101. And furthermore, as the signals of the I path and the Q path experience different paths, magnitudes of their relative power usually change at an output end of the modulator 101, and such a change is referred to as IQ amplitude imbalance of the optical transmitter.

Generally, a phase offset drift and an amplitude imbalance of the optical transmitter end are collectively referred to as optical transmitter IQ imbalance; wherein, both the phase offset drift and the IQ amplitude imbalance have effects on a shape of a constellation diagram of the received signals and increase bit error rates. FIG. 2 is a schematic diagram of the effect of the optical transmitter IQ imbalance on the constellation diagram of the received signals. As shown in FIG. 2, the constellation diagram on the left side denotes the transmitted signals, and the constellation diagram on the right side denotes the received signals. And due to the effect of the optical transmitter IQ imbalance, the constellation diagram of the received signals at the receiver end becomes a distorted parallelogram.

In an existing method, estimation and compensation of the IQ imbalance are generally performed based on Gram-Schmidt orthogonalization (GSOP), in which received signals of the I path or the Q path are taken as reference signals.

It should be noted that the above description of the background is merely provided for clear and complete explanation of this disclosure and for easy understanding by those skilled in the art. And it should not be understood that the above technical solution is known to those skilled in the art as it is described in the background of this disclosure.

SUMMARY

Additional aspects and/or advantages will be set forth in part in the description which follows and, in part, will be apparent from the description, or may be learned by practice of the disclosure.

It was found by the inventors that in the above existing method, a phase of the reference signal is easily influenced by an equalizer at receiving end and is inverse, and hence, an estimated direction of a phase offset drift is unstable. In addition, accuracy of its estimation of phase offset drift at larger angles is relatively poor. Moreover, after the IQ imbalance is compensated by using the above existing method, a constellation diagram of received signals may not be in parallel with a rectangular axis. That is, the existing method may also recover the distorted parallelogram constellation diagram on the right side in FIG. 2 into a square. However, a symmetry axis of the square may be offset from a symmetry axis of the constellation diagram of the transmitted signals, thereby resulting in a decision error.

Embodiments of this disclosure provide an estimation apparatus for IQ imbalance of an optical transmitter, a compensation apparatus for IQ imbalance of an optical transmitter and electronic equipment. Estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

According to a first aspect of the embodiments of this disclosure, there is provided an estimation apparatus for IQ imbalance of an optical transmitter, including: an acquiring unit configured to obtain I-path received signals and Q-path received signals at an optical receiver side; a coupling unit configured to perform alternating current (AC) coupling on the obtained I-path received signals and Q-path received signals; and an estimating unit configured to estimate the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

According to a second aspect of the embodiments of this disclosure, there is provided a compensation apparatus for IQ imbalance of an optical transmitter, including: the estimation apparatus for IQ imbalance of an optical transmitter as described in the first aspect of the embodiments of this disclosure; and a first compensating unit configured to, at an optical receiver end, compensate the IQ imbalance of the optical transmitter for the AC coupled I-path received signals and Q-path received signals according to an inverse matrix of the transform matrix, or, a second compensating unit configured to, at an optical transmitter end, pre-compensate for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

According to a third aspect of the embodiments of this disclosure, there is provided electronic equipment, including: the estimation apparatus for IQ imbalance of an optical transmitter as described in the first aspect of the embodiments of this disclosure or the compensation apparatus for IQ imbalance of an optical transmitter as described in the second aspect of the embodiments of this disclosure.

According to a fourth aspect of the embodiments of this disclosure, there is provided an estimation method for IQ imbalance of an optical transmitter, including: obtaining I-path received signals and Q-path received signals at an optical receiver side; performing AC coupling on the obtained I-path received signals and Q-path received signals; and estimating the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

According to a fifth aspect of the embodiments of this disclosure, there is provided a compensation method for IQ imbalance of an optical transmitter, including: the estimation method for IQ imbalance of an optical transmitter as described in the fourth aspect of the embodiments of this disclosure; and at an optical receiver end, compensating the IQ imbalance of the optical transmitter for the AC coupled I-path received signals and Q-path received signals according to an inverse matrix of the transform matrix, or at an optical transmitter end, pre-compensating for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

An advantage of the embodiments of this disclosure exists in that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

With reference to the following description and drawings, the particular embodiments of this disclosure are disclosed in detail, and the principle of this disclosure and the manners of use are indicated. It should be understood that the scope of the embodiments of this disclosure is not limited thereto. The embodiments of this disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising/includes/including" when used in this specification is taken to specify the presence of stated features, integers, steps or components but does not preclude the presence or addition of one or more other features, integers, steps, components or groups thereof.

BRIEF DESCRIPTION OF THE DRAWINGS

The drawings are included to provide further understanding of this disclosure, which constitute a part of the specification and illustrate the preferred embodiments of this disclosure, and are used for setting forth the principles of this disclosure together with the description. It is obvious that the accompanying drawings in the following description are some embodiments of this disclosure, and for those of ordinary skills in the art, other accompanying drawings may be obtained according to these accompanying drawings without making an inventive effort. In the drawings.

DETAILED DESCRIPTION

Figure 1:
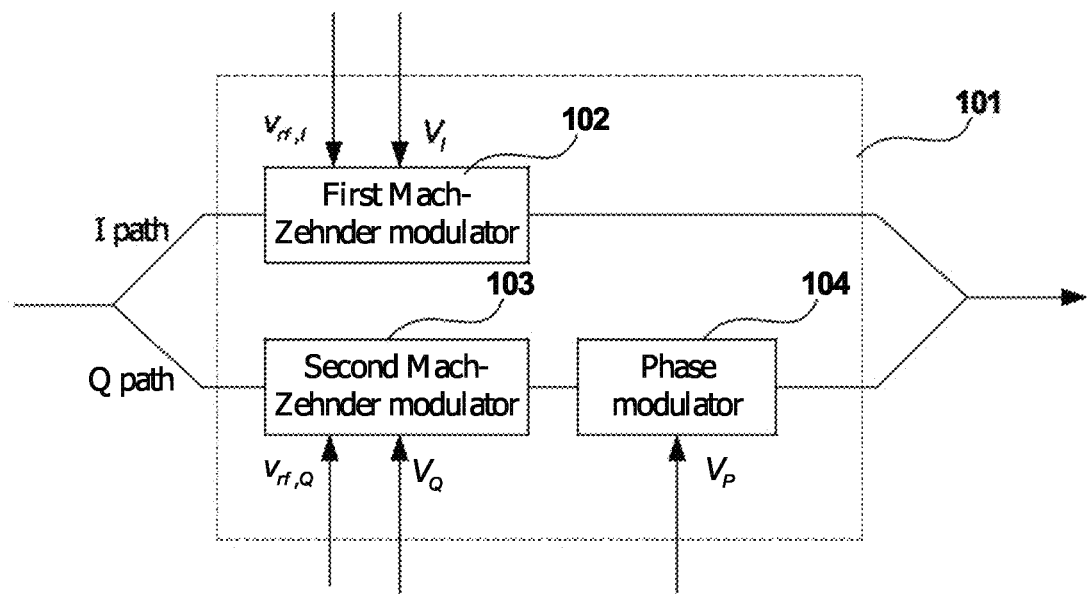
FIG. 1 is a schematic diagram of a modulator of an optical transmitter in the related art.

Reference will now be made in detail to the embodiments, examples of which are illustrated in the accompanying drawings, wherein like reference numerals refer to the like elements throughout. The embodiments are described below to explain the disclosure by referring to the figures.

In the embodiments of this disclosure, terms "first", and "second", etc., are used to differentiate different elements with respect to names, and do not indicate spatial arrangement or temporal orders of these elements, and these elements should not be limited by these terms. Terms "and/or" include any one and all combinations of one or more relevantly listed terms. Terms "contain", "include" and "have" refer to existence of stated features, elements, components, or assemblies, but do not exclude existence or addition of one or more other features, elements, components, or assemblies.

In the embodiments of this disclosure, single forms "a", and "the", etc., include plural forms, and should be understood as "a kind of" or "a type of" in a broad sense, but should not defined as a meaning of "one"; and the term "the" should be understood as including both a single form and a plural form, except specified otherwise. Furthermore, the term "according to" should be understood as "at least partially according to", the term "based on" should be understood as "at least partially based on", except specified otherwise.

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited correspondingly in scope. Rather, the disclosure includes all changes, modifications and equivalents coming within the terms of the appended claims.

Embodiment 1

Figure 3:
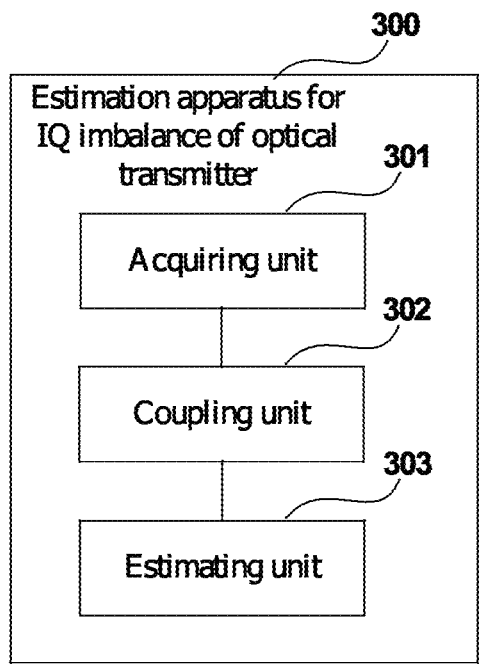
FIG. 3 is a schematic diagram of the estimation apparatus for IQ imbalance of an optical transmitter of Embodiment 1 of this disclosure.

FIG. 3 is a schematic diagram of the estimation apparatus for IQ imbalance of an optical transmitter of Embodiment 1 of this disclosure. As shown in FIG. 3, an estimation apparatus 300 includes:

an acquiring unit 301 configured to obtain -path received signals and Q-path received signals at an optical receiver side;

a coupling unit 302 configured to perform AC coupling on the obtained I-path received signals and Q-path received signals; and an estimating unit 303 configured to estimate the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

In this embodiment, the acquiring unit 301 may obtain I path received signals and Q path received signals by using an existing method. For example, for a coherent optical communications system, coherent detection, analog-to-digital conversion and constellation diagram recovery may be performed on I path received signals and Q path received signals at an optical receiver end. For example, the constellation diagram recovery may include IQ imbalance compensation, resampling, channel equalization and carrier phase recovery at the receiver end.

In this embodiment, the coupling unit 302 is configured to perform AC coupling on the obtained I path received signals and Q path received signals, to remove an effect of DC offset drift of a modulator in the optical transmitter.

In this embodiment, the estimating unit 303 is configured to estimate the IQ imbalance of the optical transmitter on the AC coupled I-path received signals and Q-path received signals according to the estimation model based on the transform matrix of the received signals and transmitted signals, the transform matrix including the parameters related to the amplitude change and phase change of the I-path transmitted signals and Q-path transmitted signals by the optical transmitter.

In this embodiment, the received signals at the receiver end may be expressed by formula (1) below:

$$I_1 + j*Q_1 = be^{j\theta_I}*I_0 + j*ae^{j\theta_Q}*Q_0 \qquad (1)$$

where $(I_1, Q_1)$ denotes the received signals, $(I_0, Q_0)$ denotes the transmitted signals, a and b respectively denote values of the amplitude changes of the I-path transmitted signals and Q-path transmitted signals by the optical transmitter, and $\theta_I$ and $\theta_Q$ respectively denote values of the phase changes of the I-path transmitted signals and Q-path transmitted signals by the optical transmitter.

Above formula (1) is converted into a matrix form, which may be expressed as formulae (2) and (3) below:

$$\begin{bmatrix} I_1 \\ Q_1 \end{bmatrix} = C \begin{bmatrix} I_0 \\ Q_0 \end{bmatrix}, \qquad (2)$$

$$C = \begin{bmatrix} b\cos(\theta_I) & -a\sin(\theta_Q) \\ b\sin(\theta_I) & a\cos(\theta_Q) \end{bmatrix}; \qquad (3)$$

where $(I_1, Q_1)$ denotes the received signals, $(I_0, Q_0)$ denotes the transmitted signals, a and b respectively denote values of the amplitude changes of the I-path transmitted signals and Q-path transmitted signals by the optical transmitter, $\theta_I$ and $\theta_Q$ respectively denote values of the phase changes of the I-path transmitted signals and Q-path transmitted signals by the optical transmitter, and C denotes a transform matrix.

In this embodiment, what is expressed by above formula (2) is the estimation model based on a transform matrix of received signals and transmitted signals; for example, transform matrix C includes parameters related to the values of the amplitude changes b and a and phase changes $\theta_I$ and $\theta_Q$ of I-path transmitted signals and Q-path transmitted signals by the optical transmitter.

In this embodiment, the estimating unit 303 estimates the IQ imbalance of an optical transmitter on the AC coupled I-path received signals and Q-path received signals according to the estimation model based on the transform matrix of the received signals and transmitted signals. For example, the estimating unit 303 estimates transform matrix C, and hence, the parameters characterizing the IQ imbalance of an optical transmitter may be obtained.

A structure of the estimating unit 303 and a method for estimating the IQ imbalance of an optical transmitter shall be illustrated below.

Figure 4:
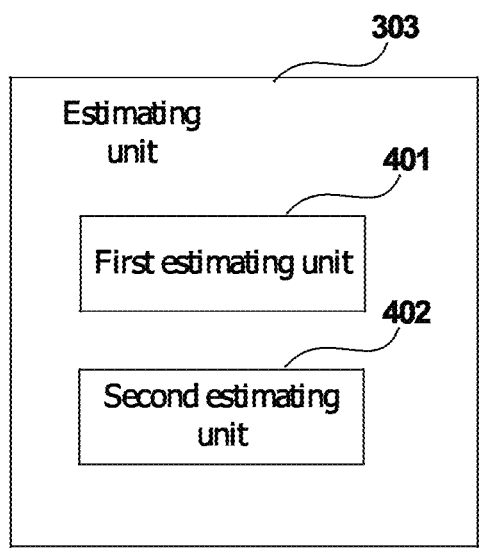
FIG. 4 is a schematic diagram of an estimating unit 303 of Embodiment 1 of this disclosure.

FIG. 4 is a schematic diagram of the estimating unit 303 of Embodiment 1 of this disclosure. As shown in FIG. 4, the estimating unit 303 includes:

a first estimating unit 401 configured to estimate the IQ imbalance of an optical transmitter on the AC coupled I-path received signals and Q-path received signals based on a training sequence; and a second estimating unit 402 configured to estimate the IQ imbalance of an optical transmitter on the AC coupled I-path received signals and Q-path received signals based on a blind estimation method.

Figure 5:
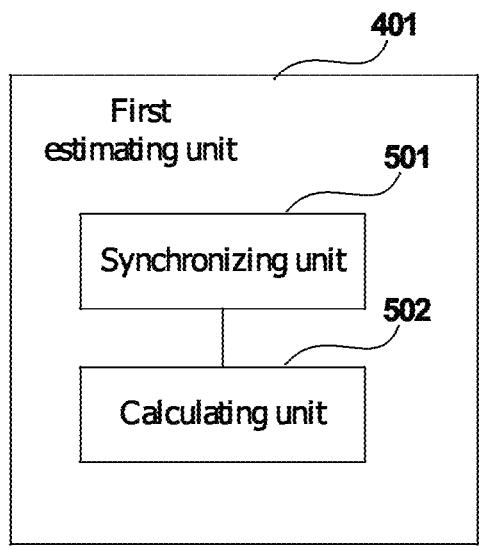
FIG. 5 is a schematic diagram of a structure of a first estimating unit 401 of Embodiment 1 of this disclosure.

FIG. 5 is a schematic diagram of a structure of the first estimating unit 401 of Embodiment 1 of this disclosure. As shown in FIG. 5, the first estimating unit 401 includes:

a synchronizing unit 501 configured to synchronize the AC coupled I-path received signals and Q-path received signals with the training sequence; and a calculating unit 502 configured to calculate the transform matrix according to the synchronized I-path received signals and Q-path received signals and the training sequence.

Figure 2:
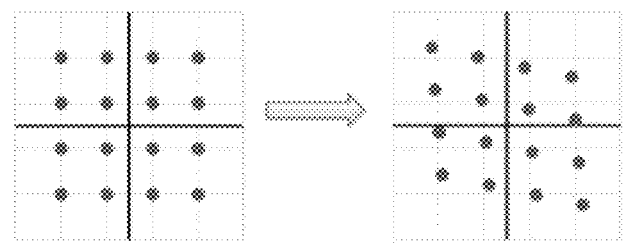
FIG. 2 is a schematic diagram of an effect of optical transmitter IQ imbalance on a constellation diagram of received signals.

In this embodiment, the first estimating unit 401 estimates the IQ imbalance of an optical transmitter on the AC coupled I-path received signals and Q-path received signals based on the training sequence, the training sequence being constituted by constellation points of the transmitted signals. For example, as shown in FIG. 2, at least 4 constellation groups may be selected from 16 constellation groups and taken as the training sequence.

In this embodiment, after the synchronizing unit 501 synchronizes the AC coupled I-path received signals and Q-path received signals with the training sequence, the calculating unit 502 calculates the transform matrix according to the synchronized I-path received signals and Q-path received signals and the training sequence.

Figure 6:
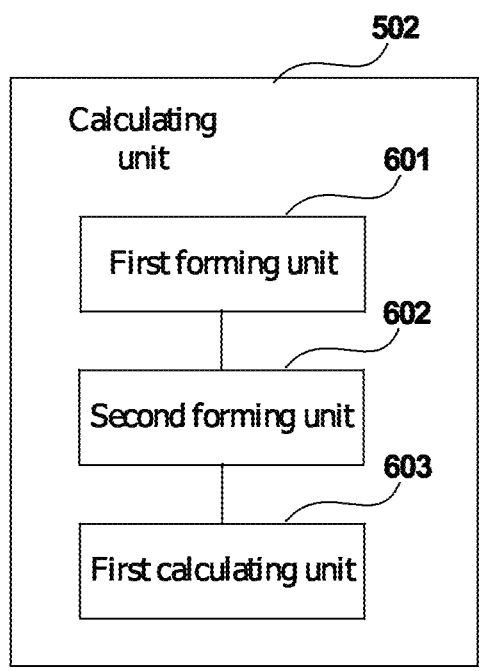
FIG. 6 is a schematic diagram of a calculating unit 502 of Embodiment 1 of this disclosure.

FIG. 6 is a schematic diagram of the calculating unit 502 of Embodiment 1 of this disclosure. As shown in FIG. 6, the calculating unit 502 includes:

a first forming unit 601 configured to make central points of constellation groups of constellation diagrams of the synchronized I-path received signals and Q-path received signals form a received constellation matrix;

a second forming unit 602 configured to make training symbols in the training sequence corresponding to the central points of constellation groups form a reference matrix; and a first calculating unit 603 configured to calculate the transform matrix according to the received constellation matrix and the reference matrix.

For example, the first form unit 601 makes the central points of constellation groups of the constellation diagram of the synchronized I-path received signals and Q-path received signals form a received constellation matrix $$\begin{bmatrix} I_1 \\ Q_1 \end{bmatrix}_{2*N},$$

the second forming unit 602 makes the training symbols in the training sequence corresponding to the central points of constellation groups form a reference matrix $$\begin{bmatrix} I_0 \\ Q_0 \end{bmatrix}_{2*N},$$

N denoting a length of the training sequence, i.e. the number of training symbols in the training sequence, and the first calculating unit 603 calculates the transform matrix C according to the received constellation matrix $$\begin{bmatrix} I_1 \\ Q_1 \end{bmatrix}_{2*N}$$

and the reference matrix $$\begin{bmatrix} I_0 \\ Q_0 \end{bmatrix}_{2*N}$$

by using above formula (2).

Figure 7:
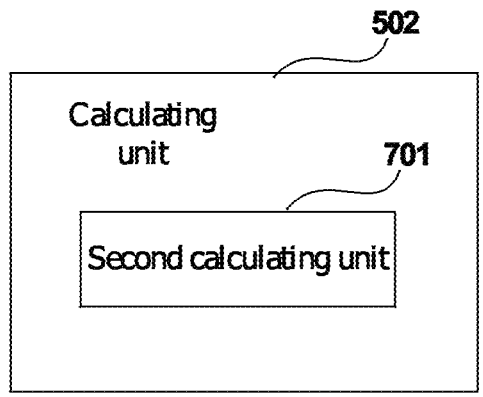
FIG. 7 is another schematic diagram of the calculating unit 502 of Embodiment 1 of this disclosure.

FIG. 7 is another schematic diagram of the calculating unit 502 of Embodiment 1 of this disclosure. As shown in FIG. 7, the calculating unit 502 includes:

a second calculating unit 701 configured to calculate the transform matrix by using a minimum mean square error criterion according to the synchronized I-path received signals and Q-path received signals and the training sequence.

For example, the second calculating unit 701 calculates the matrix C by using a minimum mean square error criterion according to the received constellation matrix $$\begin{bmatrix} I_1 \\ Q_1 \end{bmatrix}_{2*N}$$

and the reference matrix $$\begin{bmatrix} I_0 \\ Q_0 \end{bmatrix}_{2*N}$$

by using above formula (2), and obtains the matrix C denoted by formula (4) below:

$$\left( \begin{bmatrix} I_1 \\ Q_1 \end{bmatrix}_{2*N} * \begin{bmatrix} I_1 \\ Q_1 \end{bmatrix}_{2*N}^T \right) * \left( \begin{bmatrix} I_0 \\ Q_0 \end{bmatrix}_{2*N} * \begin{bmatrix} I_0 \\ Q_0 \end{bmatrix}_{2*N}^T \right)^{-1}; \quad (4)$$

where $$\begin{bmatrix} I_1 \\ Q_1 \end{bmatrix}_{2*N}$$

denotes the received constellation matrix, $$\begin{bmatrix} I_0 \\ Q_0 \end{bmatrix}_{2*N}$$

denotes the reference matrix, N denotes the length of the training sequence, $(\cdot)^T$ denotes a transposition operation of the matrix, and $(\cdot)^{-1}$ denotes an inverse operation of the matrix.

In this embodiment, the second estimating unit 402 estimates the IQ imbalance of an optical transmitter on the AC coupled I-path received signals and Q-path received signals based on the blind estimation method.

Figure 8:
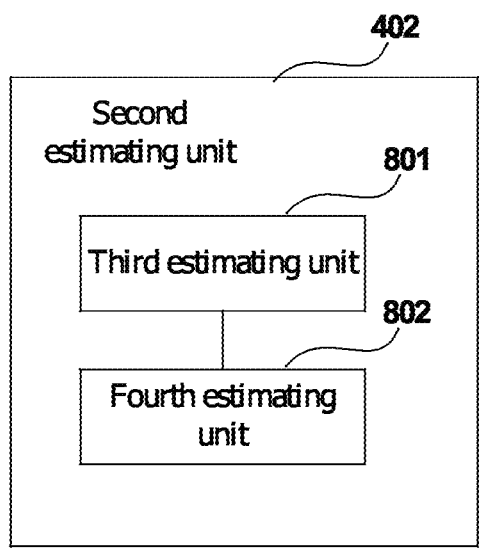
FIG. 8 is a schematic diagram of a second estimating unit 402 of Embodiment 1 of this disclosure.

FIG. 8 is a schematic diagram of the second estimating unit 402 of Embodiment 1 of this disclosure. As shown in FIG. 8, the second estimating unit 402 includes:

a third estimating unit 801 configured to, for transmitted signals of a constant modulus modulation format, calculate the transform matrix by using a constant modulus algorithm according to the AC coupled I-path received signals and Q-path received signals; and a fourth estimating unit 802 configured to, for transmitted signals of a non-constant modulus modulation format, calculate the transform matrix by using a radial orientation equalization algorithm according to the AC coupled I-path received signals and Q-path received signals.

In this embodiment, the third estimating unit 801 and the fourth estimating unit 802 may calculate the transform matrix by using existing constant modulus algorithm and radial orientation equalization algorithm.

Figure 9:
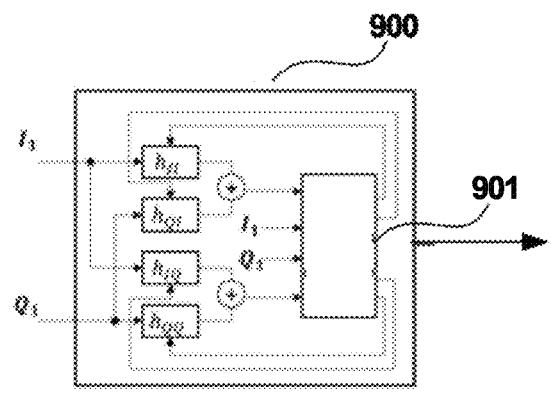
FIG. 9 is a schematic diagram of a calculating module of a constant modulus algorithm or a radial orientation equalization algorithm of Embodiment 1 of this disclosure.

FIG. 9 is a schematic diagram of a calculating module of the constant modulus algorithm or the radial orientation equalization algorithm of Embodiment 1 of this disclosure. As shown in FIG. 9, $h_{II}$, $h_{QI}$, $h_{IQ}$, and $h_{QQ}$ are four real number filters in a calculating module 900, and each of them has only one tap. An error is calculated by using the constant modulus algorithm or the radial orientation equalization algorithm and is inputted into an updating unit 901 to update tap coefficients of the four filters. And when the tap coefficients converge, the transform matrix $$C = \begin{bmatrix} h_{II} & h_{QI} \\ h_{IQ} & h_{QQ} \end{bmatrix}^{-1}$$

is obtained.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

Embodiment 2

Figure 10:
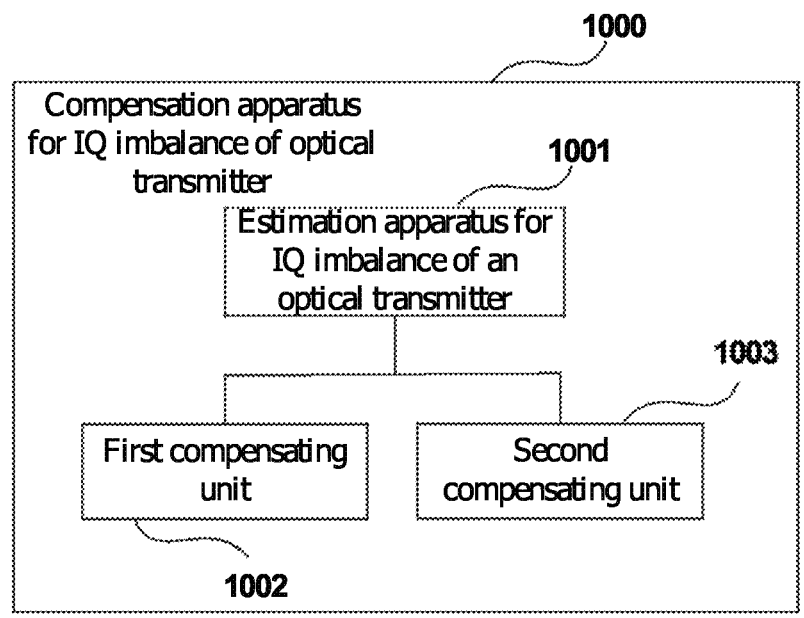
FIG. 10 is a schematic diagram of the compensation apparatus for IQ imbalance of an optical transmitter of Embodiment 2 of this disclosure.

The embodiment of this disclosure provides a compensation apparatus for IQ imbalance of an optical transmitter. FIG. 10 is a schematic diagram of the compensation apparatus for IQ imbalance of an optical transmitter of Embodiment 2 of this disclosure. As shown in FIG. 10, a compensation apparatus 1000 includes:

an estimation apparatus 1001 for IQ imbalance of an optical transmitter; and a first compensating unit 1002 configured to, at an optical receiver end, compensate the IQ imbalance of the optical transmitter for the AC coupled I-path received signals and Q-path received signals according to an inverse matrix of the transform matrix, or, a second compensating unit 1003 configured to, at an optical transmitter end, pre-compensate for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix.

In this embodiment, the estimation apparatus 1001 for IQ imbalance of an optical transmitter is identical to that described in Embodiment 1, and shall not be described herein any further.

In this embodiment, the first compensating unit 1002 configured to, at the optical receiver end, compensate the IQ imbalance of the optical transmitter for the AC coupled I-path received signals and Q-path received signals according to the inverse matrix of the transform matrix.

For example, the first compensating unit 1002 transforms the AC coupled I-path received signals and Q-path received signals by directly using an inverse matrix $C^{-1}$ of the transform matrix C, to obtain compensated I-path received signals and Q-path received signals.

In this embodiment, the second compensating unit 1003 configured to, at the optical transmitter end, pre-compensate for the I-path transmitted signals and Q-path transmitted signals according to at least one of the ratio of the amplitude changes of the I-path transmitted signals and the Q-path transmitted signals obtained from the transform matrix, the difference between the phase changes of the I-path transmitted signals and the Q-path transmitted signals and the transform matrix.

For example, the second compensating unit 1003 pre-compensates for the I-path transmitted signals and Q-path transmitted signals according to at least one or me ratio $$\alpha = \frac{a}{b}$$

of the amplitude changes and the difference $\Delta\theta = \theta_Q - \theta_I$ between the phase changes of the I-path transmitted signals and the Q-path transmitted signals obtained according to elements in the transform matrix C and the transform matrix C.

For example, the second compensating unit 1003 performs compensation for the amplitude imbalance by using a matrix $$\begin{bmatrix} 1 & 0 \\ 0 & \alpha \end{bmatrix}^{-1},$$

or performs compensation for the phase offset drift by using a matrix $$\begin{bmatrix} 1 & -\sin(\Delta\theta_p) \\ 0 & \cos(\Delta\theta_p) \end{bmatrix}^{-1},$$

or performs compensation for the amplitude imbalance and the phase offset drift by using the inverse matrix $C^{-1}$ of the transform matrix C.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

Embodiment 3

Figure 11:
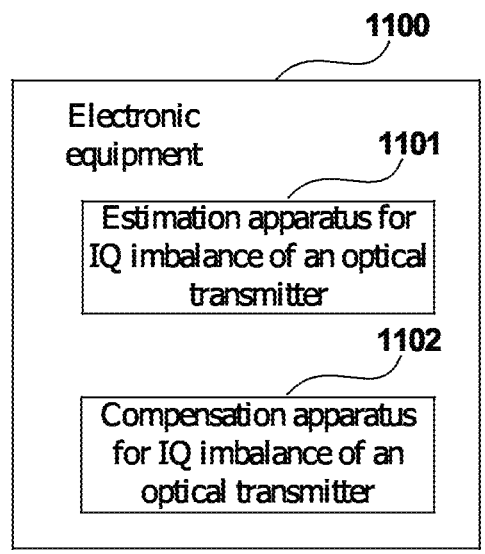
FIG. 11 is a schematic diagram of the electronic equipment of Embodiment 3 of this disclosure.

The embodiment of this disclosure provides electronic equipment. FIG. 11 is a schematic diagram of the electronic equipment of Embodiment 3 of this disclosure. As shown in FIG. 11, electronic equipment 1100 includes an estimation apparatus 1101 for IQ imbalance of an optical transmitter or a compensation apparatus 1102 for IQ imbalance of an optical transmitter. The estimation apparatus 1101 for IQ imbalance of an optical transmitter and the compensation apparatus 1102 for IQ imbalance of an optical transmitter are identical to those described in embodiments 1 and 2, and shall not be described herein any further.

In this embodiment, the electronic equipment may be a stand-alone device, or may be integrated into an optical receiver or an optical transmitter.

Figure 12:
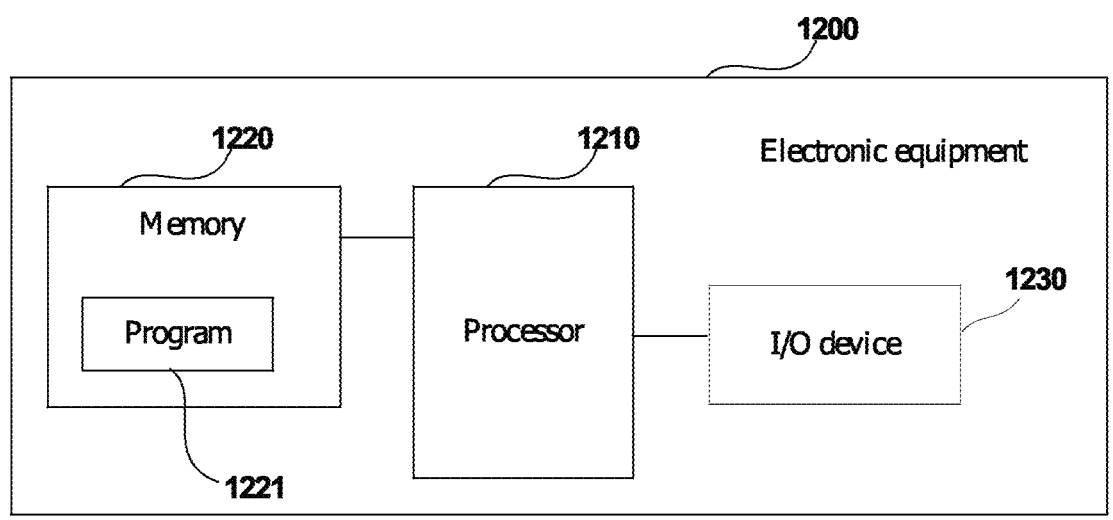
FIG. 12 is a block diagram of a systematic structure the electronic equipment of Embodiment 3 of this disclosure.

FIG. 12 is a block diagram of a systematic structure the electronic equipment of Embodiment 3 of this disclosure. As shown in FIG. 12, electronic equipment 1200 may include a processor 1210 and a memory 1220, the memory 1220 being coupled to the processor 1210. For example, the memory 1220 may store various data, and furthermore, it may store a program 1221 for information processing, and execute the program 1221 under control of the processor 1210.

In one implementation, functions of the estimation apparatus 1101 may be integrated into the processor 1210. For example, the processor 1210 may be configured to: obtain I-path received signals and Q-path received signals at an optical receiver side; perform AC coupling on the obtained I-path received signals and Q-path received signals; and estimate the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

For example, the estimating the IQ imbalance of an optical transmitter on the AC coupled I-path received signals and Q-path received signals includes: estimating the IQ imbalance of an optical transmitter on the AC coupled I-path received signals and Q-path received signals based on a training sequence.

For example, the estimating the IQ imbalance of an optical transmitter on the AC coupled I-path received signals and Q-path received signals based on a training sequence includes: synchronizing the AC coupled I-path received signals and Q-path received signals with the training sequence; and calculating the transform matrix according to the synchronized I-path received signals and Q-path received signals and the training sequence.

For example, the calculating the transform matrix according to the synchronized I-path received signals and Q-path received signals and the training sequence includes: making central points of constellation groups of constellation diagrams of the synchronized I-path received signals and Q-path received signals form a received constellation matrix; making training symbols in the training sequence corresponding to the central points of constellation groups form a reference matrix; and calculating the transform matrix according to the received constellation matrix and the reference matrix.

For example, the calculating the transform matrix according to the synchronized I-path received signals and Q-path received signals and the training sequence includes: calculating the transform matrix by using a minimum mean square error criterion according to the synchronized I-path received signals and Q-path received signals and the training sequence.

For example, the estimating the IQ imbalance of an optical transmitter on the AC coupled I-path received signals and Q-path received signals includes: estimating the IQ imbalance of an optical transmitter on the AC coupled I-path received signals and Q-path received signals based on a blind estimation method.

For example, the estimating the IQ imbalance of an optical transmitter on the AC coupled I-path received signals and Q-path received signals based on a blind estimation method includes: for transmitted signals of a constant modulus modulation format, calculating the transform matrix by using a constant modulus algorithm according to the AC coupled I-path received signals and Q-path received signals; and for transmitted signals of a non-constant modulus modulation format, calculating the transform matrix by using a radial orientation equalization algorithm according to the AC coupled I-path received signals and Q-path received signals.

In one implementation, functions of the compensation apparatus 1102 may be integrated into the processor 1210. For example, the processor 1210 may further be configured to: compensate the IQ imbalance of the optical transmitter for the AC coupled I-path received signals and Q-path received signals according to an inverse matrix of the transform matrix; or, at an optical transmitter end, pre-compensate for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

In another implementation, the estimation apparatus 1101 or the compensation apparatus 1102 and the central processing unit 401 and the processor 1210 may be configured separately. For example, the estimation apparatus 1101 or the compensation apparatus 1102 may be configured as a chip connected to the processor 1210, with its functions being realized under control of the processor 1210.

And furthermore, as shown in FIG. 12, the electronic equipment 1200 may further include an input/output (I/O) device 1230, etc. For example, functions of above components are similar to those in the related art, and shall not be described herein any further. It should be noted that the electronic equipment 1200 does not necessarily include all parts shown in FIG. 12, and furthermore, the electronic equipment 1200 may include parts not shown in FIG. 12, and the related art may be referred to.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

Embodiment 4

The embodiment of this disclosure provides an estimation method for IQ imbalance of an optical transmitter, corresponding to the estimation apparatus for IQ imbalance of an optical transmitter in Embodiment 1.

Figure 13:
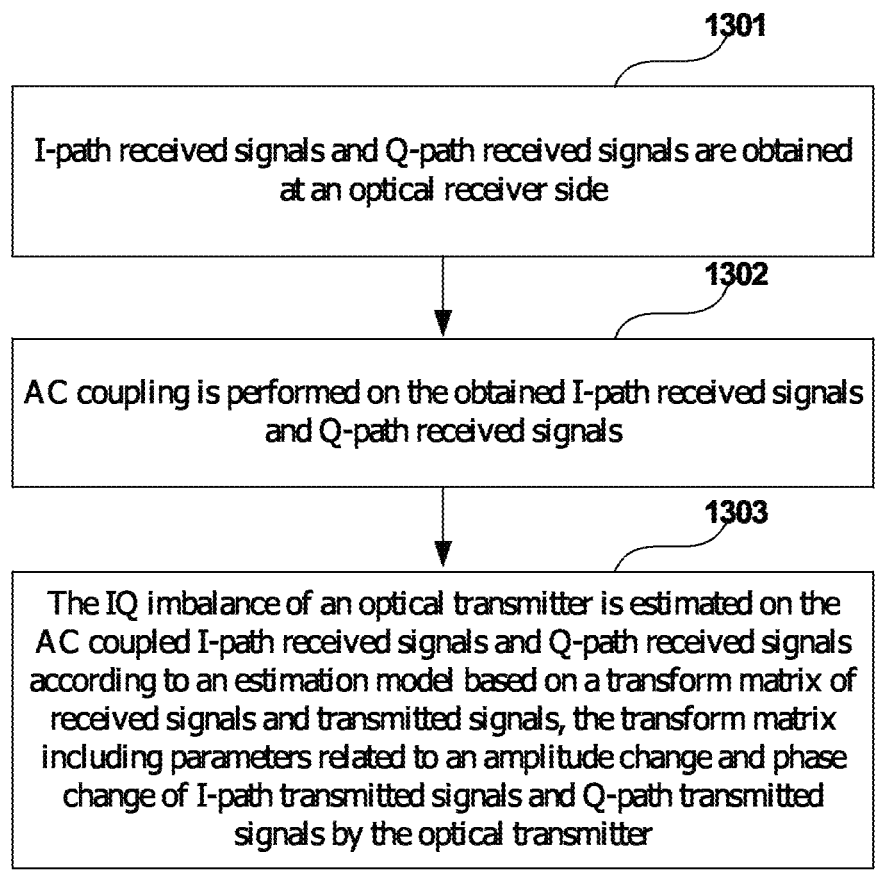
FIG. 13 is a flowchart of the estimation method for IQ imbalance of an optical transmitter of Embodiment 4 of this disclosure.

FIG. 13 is a flowchart of the estimation method for IQ imbalance of an optical transmitter of Embodiment 4 of this disclosure. The method includes:

Step 1301: I-path received signals and Q-path received signals are obtained at an optical receiver side;

Step 1302: AC coupling is performed on the obtained I-path received signals and Q-path received signals; and Step 1303: the IQ imbalance of an optical transmitter is estimated on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

In this embodiment, particular implementations of the above steps are similar to those described in Embodiment 1, and shall not be described herein any further.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

Embodiment 5

The embodiment of this disclosure provides a compensation method for IQ imbalance of an optical transmitter, corresponding to the compensation apparatus for IQ imbalance of an optical transmitter in Embodiment 2.

Figure 14:
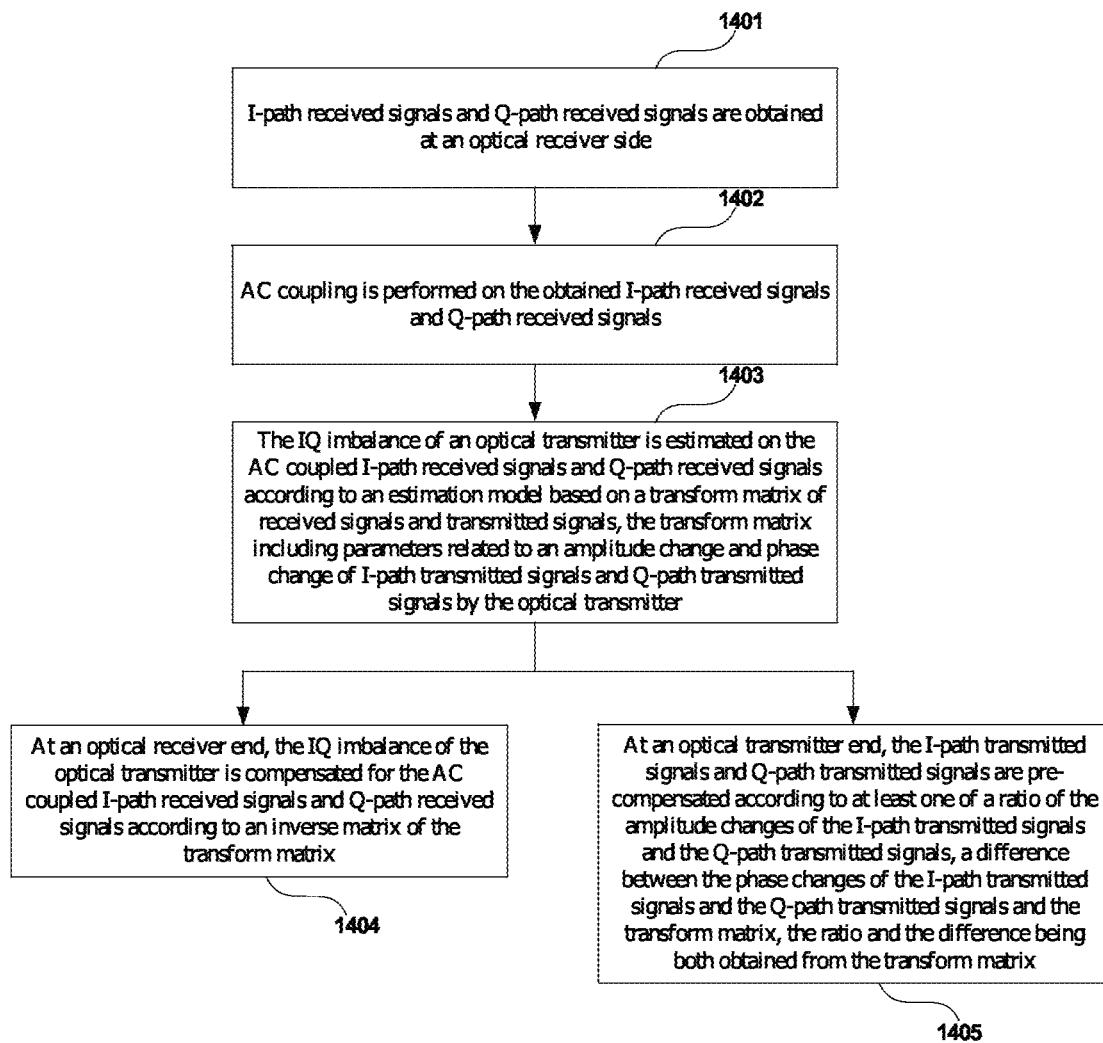
FIG. 14 is a flowchart of the compensation method for IQ imbalance of an optical transmitter of Embodiment 5 of this disclosure.

FIG. 14 is a flowchart of the compensation method for IQ imbalance of an optical transmitter of Embodiment 5 of this disclosure. The method includes:

Step 1401: I-path received signals and Q-path received signals are obtained at an optical receiver side:

Step 1402: AC coupling is performed on the obtained I-path received signals and Q-path received signals;

Step 1403: the IQ imbalance of an optical transmitter is estimated on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter;

Step 1404: at an optical receiver end, the IQ imbalance of the optical transmitter is compensated for the AC coupled I-path received signals and Q-path received signals according to an inverse matrix of the transform matrix; or, Step 1405: at an optical transmitter end, the I-path transmitted signals and Q-path transmitted signals are pre-compensated according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

In this embodiment, particular implementations of the above steps are similar to those described in embodiments 1 and 2, and shall not be described herein any further.

It can be seen from the above embodiment that estimation and compensation of IQ imbalance of an optical transmitter are performed by directly using an estimation model based on a transform matrix of received signals and transmitted signals, therefore, a phase offset shift may be estimated accurately, and precision of estimation of drifts of various angles is ensured, furthermore, accurate recovery of the constellation diagram of received signals is achieved.

An embodiment of the present disclosure provides a computer readable program, which, when executed in an estimation apparatus for IQ imbalance of an optical transmitter or electronic equipment, will cause the estimation apparatus for IQ imbalance of an optical transmitter or the electronic equipment to carry out the estimation method for IQ imbalance of an optical transmitter as described in Embodiment 3.

An embodiment of the present disclosure provides a computer readable program, which, when executed in a compensation apparatus for IQ imbalance of an optical transmitter or electronic equipment, will cause the compensation apparatus for IQ imbalance of an optical transmitter or the electronic equipment to carry out the compensation method for IQ imbalance of an optical transmitter as described in Embodiment 4.

An embodiment of the present disclosure provides a computer storage medium, including a computer readable program, which will cause an estimation apparatus for IQ imbalance of an optical transmitter or electronic equipment to carry out the estimation method for IQ imbalance of an optical transmitter as described in Embodiment 3.

An embodiment of the present disclosure provides a computer storage medium, including a computer readable program, which will cause a compensation apparatus for IQ imbalance of an optical transmitter or electronic equipment to carry out the compensation method for IQ imbalance of an optical transmitter as described in Embodiment 4.

The estimation method for IQ imbalance of an optical transmitter or the compensation method for IQ imbalance of an optical transmitter carried out in the estimation apparatus for IQ imbalance of an optical transmitter, or the compensation apparatus for IQ imbalance of an optical transmitter, or the electronic equipment, described with reference to the embodiments of this disclosure, may be directly embodied as hardware, software modules executed by a processor, or a combination thereof. For example, one or more functional block diagrams and/or one or more combinations of the functional block diagrams shown in FIG. 3 or FIG. 10 may either correspond to software modules of procedures of a computer program, or correspond to hardware modules. Such software modules may respectively correspond to the steps shown in FIGS. 13 and 14. And the hardware module, for example, may be carried out by firming the soft modules by using a field programmable gate array (FPGA).

The soft modules may be located in an RAM, a flash memory, an ROM, an EPROM, and an EEPROM, a register, a hard disc, a floppy disc, a CD-ROM, or any memory medium in other forms known in the art. A memory medium, such as a non-transitory storage medium, may be coupled to a processor, so that the processor may be able to read information from the memory medium, and write information into the memory medium; or the memory medium may be a component of the processor. The processor and the memory medium may be located in an ASIC. The soft modules may be stored in a memory of a mobile terminal, and may also be stored in a memory card of a pluggable mobile terminal. For example, if equipment (such as a mobile terminal) employs an MEGA-SIM card of a relatively large capacity or a flash memory device of a large capacity, the soft modules may be stored in the MEGA-SIM card or the flash memory device of a large capacity.

One or more functional blocks and/or one or more combinations of the functional blocks in FIG. 3 and FIG. 10 may be realized as a universal processor, a digital signal processor (DSP), an application-specific integrated circuit (ASIC), a field programmable gate array (FPGA) or other programmable logic devices, discrete gate or transistor logic devices, discrete hardware component or any appropriate combinations thereof carrying out the functions described in this application. And the one or more functional block diagrams and/or one or more combinations of the functional block diagrams in the accompanying drawings may also be realized as a combination of computing equipment, such as a combination of a DSP and a microprocessor, multiple processors, one or more microprocessors in communications combination with a DSP, or any other such configuration.

This disclosure is described above with reference to particular embodiments. However, it should be understood by those skilled in the art that such a description is illustrative only, and not intended to limit the protection scope of the present disclosure. Various variants and modifications may be made by those skilled in the art according to the principle of the present disclosure, and such variants and modifications fall within the scope of the present disclosure.

For implementations containing the above embodiments, following supplements are further disclosed, Supplement 1. An estimation apparatus for IQ imbalance of an optical transmitter, including:
an acquiring unit configured to obtain I-path received signals and Q-path received signals at an optical receiver side;
a coupling unit configured to perform AC coupling on the obtained I-path received signals and Q-path received signals; and
an estimating unit configured to estimate the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

Supplement 2. The apparatus according to supplement 1, wherein the estimating unit includes:
a first estimating unit configured to estimate the IQ imbalance of an optical transmitter on the AC coupled I-path received signals and Q-path received signals based on a training sequence.

Supplement 3. The apparatus according to supplement 2, wherein the first estimating unit includes:
a synchronizing unit configured to synchronize the AC coupled I-path received signals and Q-path received signals with the training sequence; and
a calculating unit configured to calculate the transform matrix according to the synchronized I-path received signals and Q-path received signals and the training sequence.

Supplement 4. The apparatus according to supplement 3, wherein the calculating unit includes:
a first forming unit configured to make central points of constellation groups of constellation diagrams of the synchronized I-path received signals and Q-path received signals form a received constellation matrix;
a second forming unit configured to make training symbols in the training sequence corresponding to the central points of constellation groups form a reference matrix; and
a first calculating unit configured to calculate the transform matrix according to the received constellation matrix and the reference matrix.

Supplement 5. The apparatus according to supplement 3, wherein the calculating unit includes:
a second calculating unit configured to calculate the transform matrix by using a minimum mean square error criterion according to the synchronized I-path received signals and Q-path received signals and the training sequence.

Supplement 6. The apparatus according to supplement 1, wherein the estimating unit includes:

a second estimating unit configured to estimate the IQ imbalance of an optical transmitter on the AC coupled I-path received signals and Q-path received signals based on a blind estimation method.

Supplement 7. The apparatus according to supplement 6, wherein the second estimating unit includes:
a third estimating unit configured to, for transmitted signals of a constant modulus modulation format, calculate the transform matrix by using a constant modulus algorithm according to the AC coupled I-path received signals and Q-path received signals; and
a fourth estimating unit configured to, for transmitted signals of a non-constant modulus modulation format, calculate the transform matrix by using a radial orientation equalization algorithm according to the AC coupled I-path received signals and Q-path received signals.

Supplement 8. The apparatus according to supplement 1, wherein the transform matrix is expressed as:

$$C = \begin{bmatrix} b\cos(\theta_I) & -a\sin(\theta_Q) \\ b\sin(\theta_I) & a\cos(\theta_Q) \end{bmatrix}; \quad (1)$$

where, b and a respectively denote the amplitude changes of the I-path transmitted signals and the Q-path transmitted signals by the optical transmitter, and $\theta_I$ and $\theta_Q$ respectively denote the phase changes of the I-path transmitted signals and Q-path transmitted signals by the optical transmitter.

Supplement 9. A compensation apparatus for IQ imbalance of an optical transmitter, including:
the estimation apparatus for IQ imbalance of an optical transmitter as described in any one of supplements 1-8; and
a first compensating unit configured to, at an optical receiver end, compensate the IQ imbalance of the optical transmitter for the AC coupled I-path received signals and Q-path received signals according to an inverse matrix of the transform matrix,
or,
a second compensating unit configured to, at an optical transmitter end, pre-compensate for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

Supplement 10. Electronic equipment, including the estimation apparatus for IQ imbalance of an optical transmitter as described in any one of supplements 1-8, or the compensation apparatus for IQ imbalance of an optical transmitter as described in supplement 9.

Supplement 11. An estimation method for IQ imbalance of an optical transmitter, including:
obtaining I-path received signals and Q-path received signals at an optical receiver side;
performing AC coupling on the obtained I-path received signals and Q-path received signals; and
estimating the IQ imbalance of an optical transmitter on the AC coupled I-path received signals and Q-path received signals according to an estimation model based on a transform matrix of received signals and transmitted signals, the transform matrix including parameters related to an amplitude change and phase change of I-path transmitted signals and Q-path transmitted signals by the optical transmitter.

Supplement 12. The method according to supplement 11, wherein the estimating the IQ imbalance of an optical transmitter on the AC coupled I-path received signals and Q-path received signals includes:
estimating the IQ imbalance of an optical transmitter on the AC coupled I-path received signals and Q-path received signals based on a training sequence.

Supplement 13. The method according to supplement 12, wherein the estimating the IQ imbalance of an optical transmitter on the AC coupled I-path received signals and Q-path received signals based on a training sequence includes:
synchronizing the AC coupled I-path received signals and Q-path received signals with the training sequence; and
calculating the transform matrix according to the synchronized I-path received signals and Q-path received signals and the training sequence.

Supplement 14. The method according to supplement 13, wherein the calculating the transform matrix according to the synchronized I-path received signals and Q-path received signals and the training sequence includes:
making central points of constellation groups of constellation diagrams of the synchronized I-path received signals and Q-path received signals form a received constellation matrix;
making training symbols in the training sequence corresponding to the central points of constellation groups form a reference matrix; and
calculating the transform matrix according to the received constellation matrix and the reference matrix, Supplement 15. The method according to supplement 13, wherein the calculating the transform matrix according to the synchronized I-path received signals and Q-path received signals and the training sequence includes:
calculating the transform matrix by using a minimum mean square error criterion according to the synchronized I-path received signals and Q-path received signals and the training sequence.

Supplement 16. The method according to supplement 11, wherein the estimating the IQ imbalance of an optical transmitter on the AC coupled I-path received signals and Q-path received signals includes:
estimating the IQ imbalance of an optical transmitter on the AC coupled I-path received signals and Q-path received signals based on a blind estimation method.

Supplement 17. The method according to supplement 16, wherein the estimating the IQ imbalance of an optical transmitter on the AC coupled I-path received signals and Q-path received signals based on a blind estimation method includes:
for transmitted signals of a constant modulus modulation format, calculating the transform matrix by using a constant modulus algorithm according to the AC coupled I-path received signals and Q-path received signals; and
for transmitted signals of a non-constant modulus modulation format, calculating the transform matrix by using a radial orientation equalization algorithm according to the AC coupled I-path received signals and Q-path received signals.

Supplement 18. The method according to supplement 11, wherein the transform matrix is expressed as:

$$C = \begin{bmatrix} b\cos(\theta_I) & -a\sin(\theta_Q) \\ b\sin(\theta_I) & a\cos(\theta_Q) \end{bmatrix}; \quad (1)$$

where, b and a respectively denote the amplitude changes of the I-path transmitted signals and the Q-path transmitted signals by the optical transmitter, and $\theta_I$ and $\theta_Q$ respectively denote the phase changes of the I-path transmitted signals and Q-path transmitted signals by the optical transmitter.

Supplement 19. A compensation method for 10 imbalance of an optical transmitter, including:
the estimation method for IQ imbalance of an optical transmitter as described in any one of supplements 11-18; and
at an optical receiver end, compensating the 10 imbalance of the optical transmitter for the AC coupled I-path received signals and Q-path received signals according to an inverse matrix of the transform matrix; or,
at an optical transmitter end, pre-compensating for the I-path transmitted signals and Q-path transmitted signals according to at least one of a ratio of the amplitude changes of the I-path transmitted signals and the Q-path transmitted signals, a difference between the phase changes of the I-path transmitted signals and the Q-path transmitted signals and the transform matrix, the ratio and the difference being both obtained from the transform matrix.

Although a few embodiments have been shown and described, it would be appreciated by those skilled in the art that changes may be made in these embodiments without departing from the principles and spirit thereof, the scope of which is defined in the claims and their equivalents.

What is claimed is:

1. An estimation apparatus for in-phase and quadrature (IQ) imbalance of an optical transmitter, comprising:
    an acquirer configured to obtain I-path received signals and Q-path received signals at an optical receiver side;
    a coupler configured to perform alternating current (AC) coupling on the obtained I-path received signals and the Q-path received signals; and
    an estimator configured to estimate the IQ imbalance of the optical transmitter on AC coupled I-path received signals and the Q-path received signals according to an estimation model based on a transform matrix of received signals and transmitted signals, the transform matrix comprising parameters related to an amplitude change and phase change of I-path transmitted signals and the Q-path transmitted signals by the optical transmitter,
    wherein the transform matrix is expressed as:

$$C = \begin{bmatrix} b\cos(\theta_I) & -a\sin(\theta_Q) \\ b\sin(\theta_I) & a\cos(\theta_Q) \end{bmatrix}; \quad (1)$$

where, b and a respectively denote the amplitude changes of the I-path transmitted signals and the Q-path transmitted signals by the optical transmitter, and $\theta_I$ and $\theta_Q$ respectively denote the phase changes of the I-path transmitted signals and the Q-path transmitted signals by the optical transmitter.

2. The apparatus according to claim 1, wherein the estimator comprises:
    a first estimator configured to estimate the IQ imbalance of the optical transmitter on the AC coupled I-path received signals and the Q-path received signals based on a training sequence.

3. The apparatus according to claim 2, wherein the first estimator comprises:

a synchronizer configured to synchronize the AC coupled I-path received signals and the Q-path received signals with the training sequence; and a calculator configured to calculate the transform matrix according to synchronized I-path received signals and the Q-path received signals and the training sequence.

4. The apparatus according to claim 3, wherein the calculating unit comprises:

a first former configured to make central points of constellation groups of constellation diagrams of the synchronized I-path received signals and the Q-path received signals form a received constellation matrix;

a second former configured to make training symbols in the training sequence corresponding to the central points of the constellation groups form a reference matrix; and a first calculator configured to calculate the transform matrix according to the received constellation matrix and the reference matrix.

5. The apparatus according to claim 4, wherein the calculating unit comprises:

a second calculator configured to calculate the transform matrix by using a minimum mean square error criterion according to the synchronized I-path received signals and the Q-path received signals and the training sequence.

6. The apparatus according to claim 1, wherein the estimator comprises:

a blind estimator configured to estimate the IQ imbalance of an optical transmitter on the AC coupled I-path received signals and the Q-path received signals based on a blind estimation method.

7. The apparatus according to claim 6, wherein the estimating unit comprises:

another estimator configured to, for transmitted signals of a constant modulus modulation format, calculate the transform matrix by using a constant modulus algorithm according to the AC coupled I-path received signals and the Q-path received signals; and a further estimator configured to, for transmitted signals of a non-constant modulus modulation format, calculate the transform matrix by using a radial orientation equalization algorithm according to the AC coupled I-path received signals and the Q-path received signals.

8. A compensation apparatus for IQ imbalance of an optical transmitter, comprising:

the estimation apparatus for IQ imbalance of an optical transmitter as claimed in claim 1; and one of:

a first compensator configured to, at an optical receiver end, compensate the IQ imbalance of the optical transmitter for the AC coupled I-path received signals and the Q-path received signals according to an inverse matrix of the transform matrix, and a second compensator configured to, at an optical transmitter end, pre-compensate for the I-path transmitted signals and Q-path transmitted signals according to at least one of a ratio of: amplitude changes of the I-path transmitted signals and the Q-path transmitted signals, and a difference between phase changes of the I-path transmitted signals and the Q-path transmitted signals and the transform matrix, with the ratio and the difference being both obtained from the transform matrix.

9. Electronic equipment, comprising one of the estimation apparatus for IQ imbalance of an optical transmitter as claimed in claim 1, and the compensation apparatus for IQ imbalance of an optical transmitter as claimed in claim 8.

10. A method, comprising:

obtaining I-path received signals and Q-path received signals at an optical receiver side;

performing alternating current (AC) coupling on the obtained I-path received signals and Q-path received signals; and estimating the IQ imbalance of an optical transmitter on the AC coupled I-path received signals and Q-path received signals according to an estimation model based on a transform matrix of received signals and transmitted signals, the transform matrix comprising parameters related to an amplitude change and phase change of I-path transmitted signals and Q-path transmitted signals by the optical transmitter, wherein the transform matrix is expressed as:

$$C = \begin{bmatrix} b\cos(\theta_I) & -a\sin(\theta_Q) \\ b\sin(\theta_I) & a\cos(\theta_Q) \end{bmatrix}; \tag{1}$$

where, b and a respectively denote the amplitude changes of the I-path transmitted signals and the Q-path transmitted signals by the optical transmitter, and $\theta_I$ and $\theta_Q$ respectively denote the phase changes of the I-path transmitted signals and the Q-path transmitted signals by the optical transmitter.

11. A non-transitory computer readable storage storing a method according to claim 9 for controlling a computer.

* * * * *